(12) United States Patent
Parker et al.

(10) Patent No.: US 7,391,259 B2
(45) Date of Patent: Jun. 24, 2008

(54) POWER AMPLIFIER

(75) Inventors: Kevin Parker, Nepean (CA); Johan Grundlingh, Kinburn (CA)

(73) Assignee: Zarbana Digital Fund LLC, Wilmington, DE (US)

( * ) Notice: Subject to any disclaimer, the term of this patent is extended or adjusted under 35 U.S.C. 154(b) by 22 days.

(21) Appl. No.: 11/490,633

(22) Filed: Jul. 21, 2006

(65) Prior Publication Data

US 2006/0255857 A1    Nov. 16, 2006

Related U.S. Application Data

(63) Continuation of application No. 10/884,627, filed on Jul. 2, 2004.

(51) Int. Cl.
*H03F 1/07* (2006.01)
*H03F 1/33* (2006.01)
*H03F 1/36* (2006.01)
*H03F 3/68* (2006.01)

(52) U.S. Cl. .................. 330/84; 330/295; 330/124 R

(58) Field of Classification Search ............. 330/295, 330/285, 124 R, 149, 51
See application file for complete search history.

(56) References Cited

U.S. PATENT DOCUMENTS

| 4,392,252 | A | 7/1983 | Cluniat |
| 4,849,712 | A | 7/1989 | Jarrett |
| 7,268,617 | B2 * | 9/2007 | Kijima ................ 330/124 R |
| 2004/0056723 | A1 * | 3/2004 | Gotou ..................... 330/295 |
| 2004/0108900 | A1 * | 6/2004 | Apel ...................... 330/285 |
| 2004/0183593 | A1 * | 9/2004 | Kwon et al. ............ 330/124 R |
| 2004/0189378 | A1 * | 9/2004 | Suzuki et al. ............. 330/52 |
| 2006/0152279 | A1 * | 7/2006 | Kijima ................ 330/124 R |

\* cited by examiner

*Primary Examiner*—Robert J. Pascal
*Assistant Examiner*—Krista M Flanagan
(74) *Attorney, Agent, or Firm*—Stolowitz Ford Cowger LLP

(57) ABSTRACT

Embodiments of the present invention comprise methods and devices for amplifying a signal by amplifying a first signal and by then amplifying a second signal only if the first signal exceeds a predetermined threshold. The first and second amplified signals are then combined, and the combination is fed back to a signal source and used to control the values of the first and second signal. The combination is further transmitted to a load. In the preferred embodiment, the first amplified signal is transmitted through an impedance inverter before it is combined with the second amplified signal.

20 Claims, 2 Drawing Sheets

POWER AMPLIFIER

The present application is a continuation of U.S. application Ser. No. 10/884,627 filed Jul. 2, 2004. Said application Ser. No. 10/884,627 is hereby incorporated by reference in its entirety.

FIELD OF THE INVENTION

The present invention relates generally to power amplifiers, and more specifically to Doherty power amplifiers.

BACKGROUND OF THE INVENTION

Referring to FIG. 1, a typical Doherty type amplifier known to the prior art includes a primary power amplifier 14 and an auxiliary power amplifier 18 whose input terminals 16 and 20 respectively are connected together at node 22. The input terminal 20 of auxiliary amplifier 18 is connected to node 22 through a phase shifter 24. Node 22 is the input terminal for an input signal 23 such as an RF signal. The output terminals 26, 28 of amplifiers 14 and 18 respectively are connected together at node 32 which is the output terminal for the amplifier pair. The output terminal 26 of primary amplifier 14 is connected to node 32 through an impedance inverter 30. Output node 32 provides the amplified output signal to a load 34.

In operation, the input signal 23 is amplified by primary amplifier 14 and passed through the impedance inverter 30 prior to being transmitted to load 34. The auxiliary amplifier 18 is turned off at this point. As the voltage applied by the primary amplifier 14 increases, the auxiliary amplifier 18 turns on. Typically the auxiliary amplifier 18 is a class C amplifier.

FIG. 2 depicts a power graph for the Doherty amplifier shown in FIG. 1. As the voltage supplied by the primary amplifier 14 increases, the output voltage increases linearly until the primary amplifier 14 reaches its output limit, 36. Eventually, the primary amplifier 14 reaches saturation, and its output voltage approaches its saturated limit. When a saturation point 37 is reached by the primary amplifier 14, the auxiliary amplifier 18 is turned on and as the input voltage is increased the output voltage is also increased linearly. The transition period marked by the powering on of auxiliary amplifier 18 is typically non-linear. Thus, a need exists for a Doherty style amplifier capable of amplifying signals without the non-linearities introduced by the powering on of the auxiliary amplifier.

SUMMARY OF THE INVENTION

In satisfaction of this need, embodiments of the present invention comprise methods and devices for amplifying a signal by amplifying a first signal and by then amplifying a second signal only if the first signal exceeds a predetermined threshold. In one embodiment, the first and second amplified signals are then combined, and a portion of this combination is fed back to the signal source and used to control the phase and amplitude of the first and second signal. This process may be referred to as predistortion. This combination is then transmitted to a load. Additionally, in various embodiments, the first amplified signal is transmitted through an impedance inverter before it is combined with the second amplified signal.

In accordance with one aspect of the invention, an amplifier is provided comprising a primary amplifier, an auxiliary amplifier, and a signal source. The output of the primary amplifier and the auxiliary amplifier are connected in parallel. Furthermore, the signal source is in electrical communication with the input terminals of the primary amplifier and the auxiliary amplifier. The signal source preferably controls the input signals of the primary amplifier and the auxiliary amplifier in response to the output signals from the primary amplifier and the auxiliary amplifier. In some embodiments, an impedance inverter is between the output of the primary amplifier and the auxiliary amplifier. Also, in some embodiments, a phase shifter is preferably between the signal source and the auxiliary amplifier. In some embodiments, the phase shifter and the impedance inverter may- be a lumped impedance element or a quarter-wave impedance inverter.

In various embodiments, the input terminals of the primary amplifier and the auxiliary amplifier are both in electrical communication with a single signal source output terminal. Alternatively, in other embodiments, the input terminal of the primary amplifier and the input terminal of the auxiliary amplifier are in electrical communication with a first output terminal of the signal source and a second output terminal of the signal source, respectively. The auxiliary amplifier, in some embodiments, has a control input terminal in electrical communication with a control output terminal of the signal source. The signal source controls the auxiliary amplifier output using the voltage detected at either or both of the output terminals of the primary amplifier and the auxiliary amplifier. In the preferred embodiment, the primary amplifier, the auxiliary amplifier and the signal source are all in electrical communication with a load. Also, in various embodiments, the DC supply to the primary amplifier or auxiliary amplifier or both may be in electrical communication with a resistor, which in turn may be in electrical communication with a voltage source. The signal source may detect the voltage across this resistor. The voltage developed across this resistor may be used by the source to determine the amount of power being absorbed by the amplifiers.

In accordance with another aspect of the invention, a method is provided for amplifying a signal. The method comprises amplifying a first signal to produce a first amplified signal, and if this first amplified signal exceeds a threshold value, amplifying a second signal to produce a second amplified signal. The method further includes combining the first amplified signal with the second amplified signal to produce an amplified output signal, and controlling the values of the first signal and the second signal using the amplified output signal. In the case that the first amplified signal does not exceed the threshold value, the auxiliary amplifier remains off and thus there will be no second amplified signal; therefore, the amplified output signal will be simply the first amplified signal.

Embodiments of this method may also include transmitting the first amplified signal through an impedance inverter before the first amplified signal is combined with the second amplified signal. In various embodiments, the method includes transmitting the second signal through a phase shifter before it is amplified by the auxiliary amplifier. In other embodiments, both the impedance inverter and the phase shifter are a lumped impedance element or a quarter-wave transmission line. Embodiments of this method may further comprise controlling the value of the first signal using the amplified output signal. The method also includes transmitting the amplified output signal to a load. Furthermore, in various embodiments, the method includes controlling the voltage of the second signal amplification using the amplified output signal. Finally, in other embodiments, the first signal and the second signal are the same signal.

BRIEF DESCRIPTION OF DRAWINGS

These and other aspects of this invention will be readily apparent from the detailed description below and the appended drawings, which are meant to illustrate and not to limit the invention, and in which.

In the drawings, like reference numbers generally refer to corresponding parts throughout the different views.

DETAILED DESCRIPTION OF THE INVENTION

Figure 3:
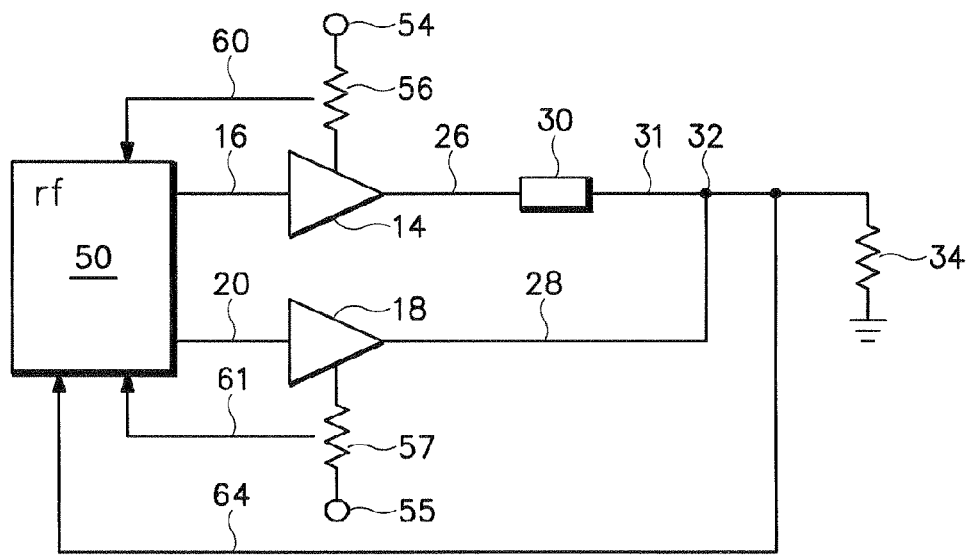
FIG. 3 depicts an embodiment of an amplifier circuit of the invention.

Referring to FIG. 3, in one embodiment of the invention, there are two amplifiers 14, 18 as in the Doherty type system known to the prior art. However in this embodiment both input terminals 16 and 20 respectively are connected directly to a signal source 50. Again the output terminals 26, 28 of primary amplifier 14 and auxiliary amplifier 18 respectively are connected together at node 32. The output terminal 26 of primary amplifier 14 is connected to node 32 through an impedance inverter 30. The node 32 acts as an output terminal supplying the amplified signal to load 34. The output signal is fed back through a feedback connection 64 to the signal source 50. The DC voltage 54 for primary amplifier 14 is connected to primary amplifier 14 through a resistor 56 and the voltage drop across the resistor 56 is monitored by the signal source 50 using connection 60. Similarly, in other embodiments, a voltage source 55 is connected to auxiliary amplifier 18 through a resistor 57 and the voltage across this resistor 57 is measured by signal source 50 using connection 61. By measuring the voltage drop across resistors 56 and 57 in connection with primary amplifier 14 and auxiliary amplifier 18, respectively, signal source 50 can determine the power being used by these amplifiers. This power consumption information may then be used by signal source 50 to optimize its output for efficiency.

In this embodiment signal source 50 comprises a digital RF source. One skilled in the art will readily recognize that signal source 50 may also comprise a Digital Signal Processor (DSP) or a variety of similar devices. A technique for predistortion is described in U.S. patent application Ser. No. 10/613,372 entitled "Adaptive Predistortion for a Transmit System." Additionally, amplifiers 14 and 18 may comprise one or more of any of the standard classes of amplifiers. However, in one embodiment, primary amplifier 14 comprises a class F amplifier and auxiliary amplifier 18 comprises an inverse class F amplifier. Furthermore, in some embodiments the impedance inverter 30 may comprise a quarter-wave transmission line or lumped impedance elements. Such lumped impedance elements are described in U.S. patent application Ser. No. 10/610,497 entitled, "Integrated Circuit Incorporating Wire Bond Inductance," the entire content of which is incorporated herein.

In operation, at low power levels, primary amplifier 14 amplifies a first signal from the signal source 50, received at terminal 16, and in turn transmits this amplified signal though the impedance inverter 30 to load 34. At higher power levels, as primary amplifier 14 begins to saturate, auxiliary amplifier 18 turns on and amplifies a second signal from the signal source, received at terminal 20, and transmits this amplified signal to load 34 via node 32. In typical embodiments, auxiliary amplifier 18 is biased so that it does not begin to operate until primary amplifier 14 has reached its saturation point. As auxiliary amplifier 18 becomes more active driving more power into load 34, its output current gradually reduces the effective load impedance as seen by primary amplifier 14, thus allowing primary amplifier 14 to deliver even more power at the same output voltage at saturation. Thus, in effect, primary amplifier 14 is able to deliver a higher power output at its saturation point.

In this embodiment, the combined amplified signals from amplifiers 14 and 18 are transmitted to signal source 50 via feedback connection 64. In one embodiment, signal source 50 receives feedback directly from output terminal 26. Moreover, in a second embodiment, signal source 50 receives feedback directly from output terminal 28, and in a third embodiment signal source 50 receives feedback directly from output terminal 31. Signal source 50 may use the received feedback to modify the signals being transmitted to at least one of amplifiers 14 and 18. In this way the predistortion is used to reduce non-linearities in the amplification. Finally, in a fourth embodiment, signal source 50 receives no feedback.

In one embodiment, the output voltage of primary amplifier 14 is determined by signal source 50, by measuring the voltage across resistor 56. Signal source 50 may then use this voltage information to adjust the signal being transmitted to either or both of amplifiers 14 and 18. The signal source 50 may also use this voltage information to measure the power consumption of primary amplifier 14 to determine when primary amplifier 14 has reached saturation. In a second embodiment signal source 50 may determine the output voltage and power consumption of auxiliary amplifier 18 in a similar fashion by measuring the voltage across a resistor in electrical communication with auxiliary amplifier 18. Signal source 50 may then optimize its output for efficiency by using the power consumption information from primary amplifier 14 and auxiliary amplifier 18.

Figure 4:
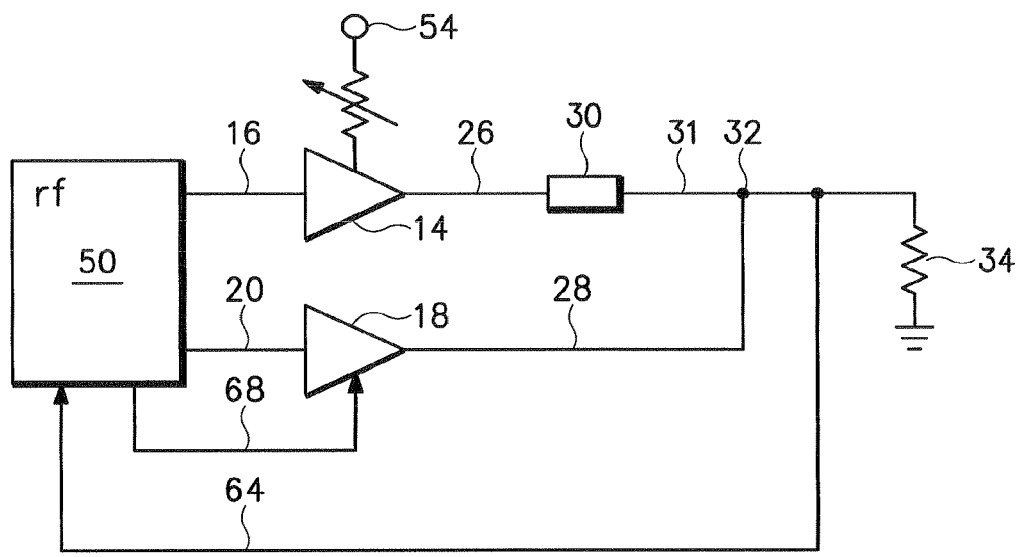
FIG. 4 depicts another embodiment of an amplifier circuit of the invention.

Referring to FIG. 4, in another embodiment of the amplifier, there are again two amplifiers 14, 18 and in this embodiment both input terminals 16 and 20 respectively are again connected directly to the signal source 50. Again the output terminals 26, 28 of amplifiers 14 and 18 respectively are connected together at node 32 and the output terminal 26 of primary amplifier 14 is connected to node 32 through the impedance inverter 30. The node 32 again acts as an output terminal supplying the amplified signal to load 34. The output signal is fed back through a feedback connection 64 to signal source 50 as in the previous embodiment. Additionally, in this embodiment, auxiliary amplifier 18 has a control terminal 68 which is connected to the signal source 50 that allows the operating point of amplifier 18 to be optimized. In various embodiments not shown here, primary amplifier 14 may also have a control terminal connected to signal source 50 that allows the operating point of amplifier 14 to be optimized.

Figure 1:
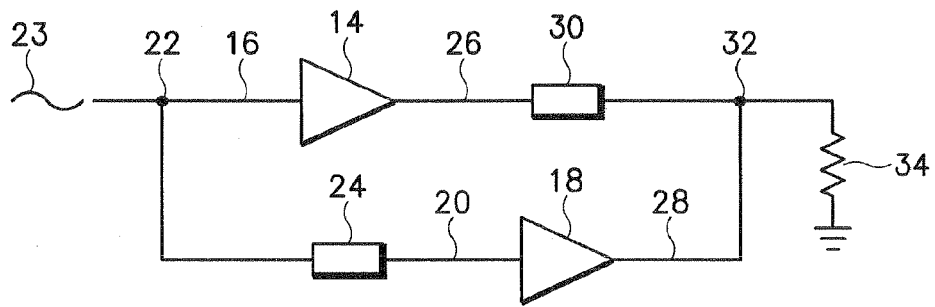
FIG. 1 depicts a Doherty type amplifier known to the prior art.
Figure 2:
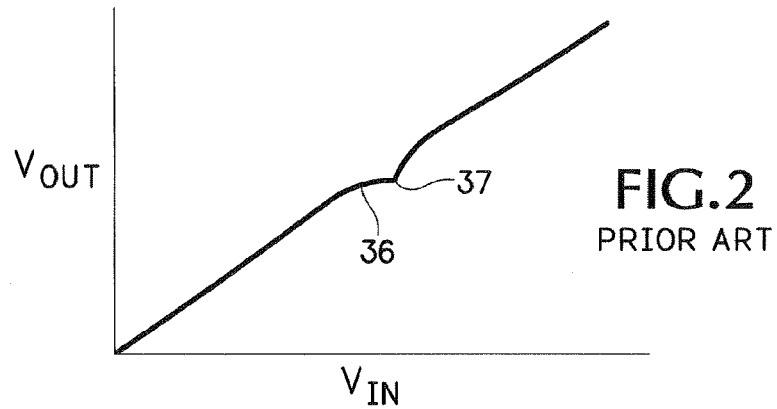
FIG. 2 depicts a power graph for the Doherty amplifier shown in FIG. 1.

This embodiment operates in an almost identical fashion to the embodiment described above in FIG. 3. However, in this embodiment the signal source controls the voltage of auxiliary amplifier 18 directly via a connection to control terminal 68 of auxiliary amplifier 18. In typical embodiments, the signal source 50 uses the signal feedback along feedback connection 64 to control the voltage and/or voltage bias to auxiliary amplifier 18. Furthermore, in one embodiment, the signal source 50 controls the voltage and/or voltage bias to auxiliary amplifier 18 based on information received about the output voltage of auxiliary amplifier 18 via measuring the voltage of a resistor in electrical communication with auxiliary amplifier 18. Similarly, in a second embodiment, the signal source 50 uses the signal feedback, received from feedback connection 64, to control the voltage and/or voltage bias of primary amplifier 14. In a third embodiment, this control of the voltage and/or voltage bias of primary amplifier 14 is based on information received about the output voltage of primary amplifier 14 as measured across resistor 56. By controlling the bias of primary amplifier 14, the non-linearity caused by the turning on of the auxiliary amplifier 18, and illustrated as point 37 in FIG. 2, may preferably be minimized; the magnitude of this non-linearity depends on the bias of the primary amplifier 14 and tends to vary with temperature load impedance and supply voltage.

Figure 5:
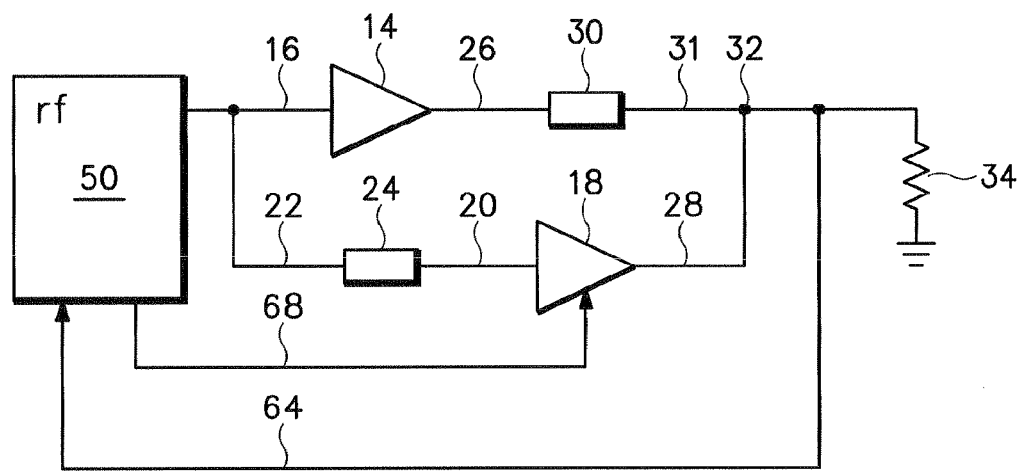
FIG. 5 depicts yet another embodiment of an amplifier circuit of the invention.

Referring to FIG. 5, in yet another embodiment of the amplifier, there are again two amplifiers 14, 18 and in this embodiment both input terminals 16 and 20 respectively are again connected to signal source 50 through a common node 22. The input terminal of auxiliary amplifier 18 is connected to node 22 through a phase shifter 24. Again the output terminals 26, 28 of amplifiers 14 and 18 respectively are connected together at node 32 and the output terminal 26 of primary amplifier 14 is connected to node 32 through the impedance inverter 30. The node 32 again acts as an output terminal supplying the amplified signal to load 34. The output signal is fed back through a feedback connection 64 to the signal source 50 as in the previous embodiments and again in this embodiment the signal source 50 controls the voltage to auxiliary amplifier 18 directly. Similarly, in some embodiments, the signal source 50 controls the voltage of primary amplifier 14 directly via a connection to a control terminal of primary amplifier 14.

In operation, a signal is transmitted from signal source 50 to both primary amplifier 14 and phase shifter 24 via node 22. The signal is further transmitted through phase shifter 24 to auxiliary amplifier 18. Primary amplifier 14 amplifies the signal and in turn transmits the amplified signal though impedance inverter 30 to load 34. As primary amplifier 14 begins to saturate, auxiliary amplifier 18 turns on and amplifies the phase shifted signal transmitted via terminal 20, and then transmits the amplified signal to load 34 via node 32. In typical embodiments, auxiliary amplifier 18 is biased so that it does not operate until primary amplifier 14 has reached its saturation point. As auxiliary amplifier 18 becomes more active driving more power into load 34, its output current gradually reduces the effective load impedance as seen by primary amplifier 14, thus allowing primary amplifier 14 to deliver even more power at the same output voltage at saturation. Thus, as in the previously described embodiments, primary amplifier 14 delivers a higher power output at its saturation point.

Also, as in the previously described embodiments, in this embodiment the combined amplified signals from amplifiers 14 and 18 are transmitted to signal source 50 via feedback connection 64. In the preferred embodiment, signal source 50 uses this feedback to modify the signal being transmitted to primary amplifier 14 and phase shifter 24, so that non-linearities in the amplification may be reduced. Additionally, in various embodiments not shown here, signal source 50 also receives feedback directly from at least one of terminals 26, 28, and 31.

Embodiments of the devices and methods described herein offer several advantages over the prior art. As the primary and auxiliary amplifiers are independently controlled, they can both be optimized to remove non-linearities associated with the operation of the auxiliary amplifier. Furthermore, there are several different means of removing non-linearities in the present invention. Examples include controlling one or both amplifiers based on the signal received from at least one of terminals 26, 28, and 31, via the feedback connection 64, and controlling the voltage and/or voltage bias of either or both of the primary amplifier 14 and the auxiliary amplifier 18 based on their respective output voltages. These extra degrees of freedom allow for optimized efficiency in the linearization process. Additionally, in embodiments utilizing a class F amplifier as the primary amplifier and an inverse class F amplifier as the auxiliary amplifier, the efficiency of the invention is increased over that of the prior art, especially when amplifying broadband signals.

It should be appreciated by those skilled in the art, that various omissions, additions and modifications may be made to the methods and systems described above without departing from the spirit of the invention. All such modifications and changes are intended to fall within the scope of the invention as illustrated by the appended claims.

The invention claimed is:

1. A method, comprising:
    amplifying a signal with a first amplifier to provide an amplified signal at an output node;
    determining whether the first amplifier has reached a saturation point by measuring a first voltage across a first resistor connected between the first amplifier and a voltage source;
    if said first amplifier reaches a saturation point, further amplifying the signal with a second amplifier coupled to the output node;
    reducing non-linearity at the output node during said further amplifying; and
    modifying the signal to the first amplifier or the second amplifier, or combinations thereof, responsive to the first voltage across the first resistor.

2. A method as claimed in claim 1, said determining being based at least in part on a voltage at the output node or a the first voltage, or combinations thereof.

3. A method as claimed in claim 1, said reducing being based at least in part on a voltage at the output node, the first voltage, a second voltage across a second resistor connected between the second amplifier and the voltage source, or combinations thereof.

4. A method as claimed in claim 1, said reducing comprising controlling a bias of the first amplifier, controlling an output of the second amplifier via a control terminal of the second amplifier, or combinations thereof.

5. An apparatus, comprising:
    a signal source to provide a signal to be amplified;
    a first amplifier to amplify the signal;
    a second amplifier to further amplify the signal if said first amplifier reaches a saturation point, said first and second amplifiers being coupled at an output node;
    where said signal source is configured to determine if the first amplifier reaches a saturation point by measuring a first voltage across a first resistor connected between the first amplifier and a voltage source and is configured to at least partially reduce a non-linearity at the output node responsive to the first voltage; and
    where said signal source is configured to modify the signal to the first amplifier or the second amplifier, or combinations thereof, responsive to the first voltage.

6. An apparatus as claimed in claim 5, said signal source being capable of receiving a voltage at the output node.

7. An apparatus as claimed in claim 5, said signal source being configured to measure a second voltage across a second resistor connected between the second amplifier and the voltage source and being configured to modify the signal to the first amplifier or the second amplifier, or combinations thereof, to at least partially reduce non-linearity at the output node responsive to the first or second voltage.

8. An apparatus as claimed in claim 5, said signal source being capable of controlling an output of the second amplifier to at least partially reduce non-linearity at the output node.

9. An apparatus as claimed in claim 5, said signal source comprising a digital RF source, a digital signal processor, or combinations thereof.

10. An apparatus as claimed in claim 5,
where the first amplifier includes a class F amplifier; and
where the second amplifier includes an inverse class F amplifier.

11. An apparatus, comprising:
means for amplifying a signal to provide an amplified signal at an output node;
means for determining whether said amplifying means has reached a saturation point by measuring a first voltage across a first resistor connected between the first amplifier and a voltage source;
means for further amplifying the signal at the output node if said amplifying means reaches a saturation point;
means for reducing non-linearity at the output node; and
means for modifying the signal to the first amplifier or the second amplifier, or combinations thereof, responsive to the first voltage across the first resistor.

12. An apparatus as claimed in claim 11, said determining means being capable of determining whether said amplifying means has reached a saturation point based at least in part on a voltage at the output node or a the first voltage, or combinations thereof.

13. An apparatus as claimed in claim 11, said reducing means being capable of reducing non-linearity at the output node based at least in part on a voltage at the output node, a the first voltage a second voltage across a second resistor connected between the further amplifying means and the voltage source, or combinations thereof.

14. An apparatus as claimed in claim 11, said reducing means being capable of reducing non-linearity at the output node by controlling a bias of the first amplifier, controlling an output of said further amplifying means via a means for controlling a voltage, of said further amplifying means, or combinations thereof.

15. An apparatus, comprising:
a Doherty type amplifier; and
a signal source configured to provide a signal to be amplified to said Doherty type amplifier said signal source being configured to at least partially reduce a non-linearity at an output node of said Doherty type amplifier;
where the signal source is configured to determine a saturation of a first amplifier in the Doherty type amplifier by measuring a first voltage across a first resistor connected between the first amplifier and a voltage source; and
where the signal source is configured to modify the signal to be amplified responsive to the first voltage.

16. An apparatus as claimed in claim 15, said signal source being capable of receiving a voltage at the output node of said Doherty amplifier.

17. An apparatus as claimed in claim 15, said signal source being capable of controlling a bias of said Doherty type amplifier to at least partially reduce non-linearity at the output node.

18. An apparatus as claimed in claim 15, said signal source being capable of controlling an output of said Doherty type amplifier at a control terminal of the Doherty type amplifier to at least partially reduce non-linearity at the output node.

19. An apparatus as claimed in claim 15, said Doherty type amplifier comprising a class F amplifier or an inverse class F amplifier, or combinations thereof.

20. An apparatus as claimed in claim 15
where the signal source is configured to determine a saturation of a second amplifier in the Doherty type amplifier by measuring a second voltage across a second resistor connected between the second amplifier and the voltage source; and
where the signal source is configured to modify the signal to be amplified responsive to the first or second voltages or combinations thereof.

* * * * *

UNITED STATES PATENT AND TRADEMARK OFFICE
CERTIFICATE OF CORRECTION

| | | |
|---|---|---|
| PATENT NO. | : 7,391,259 B2 | Page 1 of 1 |
| APPLICATION NO. | : 11/490633 | |
| DATED | : June 24, 2008 | |
| INVENTOR(S) | : Kevin Parker | |

It is certified that error appears in the above-identified patent and that said Letters Patent is hereby corrected as shown below:

At column 6, line 36, please delete "a" after the words --node or--.

At column 7, line 30, please delete "a" after the words --node or--.

At column 7, line 34, please delete "a" after the word --node,--.

At column 7, line 35, please delete "first voltage" and insert --first voltage,--.

Signed and Sealed this

Thirteenth Day of April, 2010

David J. Kappos
*Director of the United States Patent and Trademark Office*